(12) United States Patent
Morokuma et al.

(10) Patent No.: US 10,171,070 B2
(45) Date of Patent: Jan. 1, 2019

(54) SIGNAL TRANSMISSION CIRCUIT AND POWER CONVERSION DEVICE

(71) Applicant: Mitsubishi Electric Corporation, Chiyoda-ku (JP)

(72) Inventors: Kenichi Morokuma, Tokyo (JP); Jun Tomisawa, Tokyo (JP); Tetsuya Uchida, Tokyo (JP); Shoichi Orita, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/579,790

(22) PCT Filed: May 12, 2016

(86) PCT No.: PCT/JP2016/064160
§ 371 (c)(1),
(2) Date: Dec. 5, 2017

(87) PCT Pub. No.: WO2016/199536
PCT Pub. Date: Dec. 15, 2016

(65) Prior Publication Data
US 2018/0175847 A1    Jun. 21, 2018

(30) Foreign Application Priority Data
Jun. 8, 2015   (JP) ................................. 2015-115465

(51) Int. Cl.
*H03K 17/081* (2006.01)
*H02M 1/08* (2006.01)
(Continued)

(52) U.S. Cl.
CPC ........ *H03K 17/08104* (2013.01); *H02M 1/08* (2013.01); *H03K 17/0812* (2013.01); *H03K 17/691* (2013.01)

(58) Field of Classification Search
CPC ................ H02M 1/08; H03K 17/0812; H03K 17/08104; H03K 17/691
(Continued)

(56) References Cited

U.S. PATENT DOCUMENTS 7,426,239 B2 *   9/2008   Taghizadeh-Kaschani ................. H04L 25/08
326/82
8,823,438 B2 *   9/2014   Yanagishima ....... H03K 17/723
327/171
(Continued)

FOREIGN PATENT DOCUMENTS

JP   2014-007502 A   1/2014

OTHER PUBLICATIONS

International Search Report dated Jul. 26, 2016 in PCT/JP2016/064160 filed on May 12, 2016.

*Primary Examiner* — Yemane Mehari
(74) *Attorney, Agent, or Firm* — Oblon, McClelland, Maier & Neustadt, L.L.P.

(57) ABSTRACT

A first circuit outputs transmission signals that change between "H" and "L" in a period of an oscillation signal in addition to a transition time of an input signal when it changes to "H" or "L". Control protection elements invalidate induced voltage signals obtained from transformers for first and second mask periods in response to transmission signals. Buffer circuits and Schmitt circuits generate a first signal and a second signal, each indicating "H" for a relatively long period, on the basis of "H" of the induced voltage signals. A control circuit invalidates the first signal and the second signal when both the first signal and the second signal indicate "H".

10 Claims, 14 Drawing Sheets

(51) Int. Cl.
*H03K 17/691* (2006.01)
*H03K 17/0812* (2006.01)

(58) Field of Classification Search
USPC ............ 363/5, 65, 171; 327/31, 48, 73, 109,
327/142, 171, 259, 295, 296
See application file for complete search history.

(56) References Cited

U.S. PATENT DOCUMENTS

2014/0002168 A1* 1/2014 Yanagishima ........... H03K 3/01
327/296
2014/0325322 A1* 10/2014 Kaeriyama ........ H03K 17/0828
714/819

* cited by examiner

F I G. 1 1
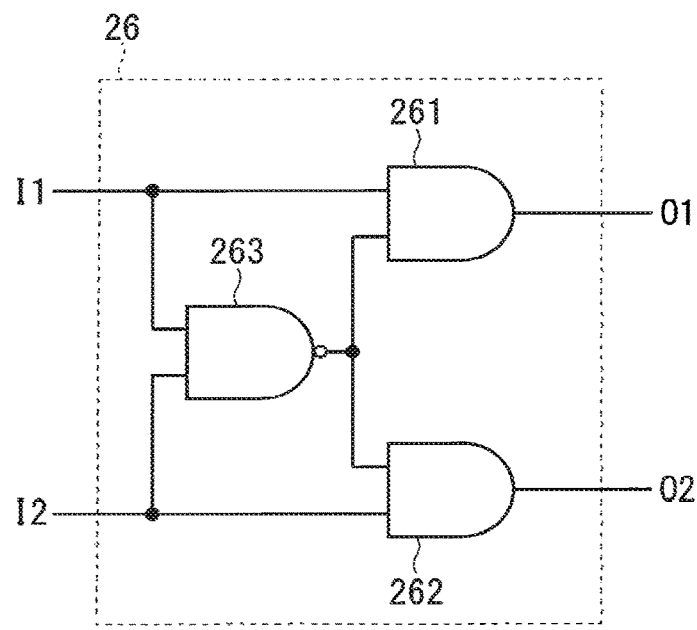
F I G. 1 2
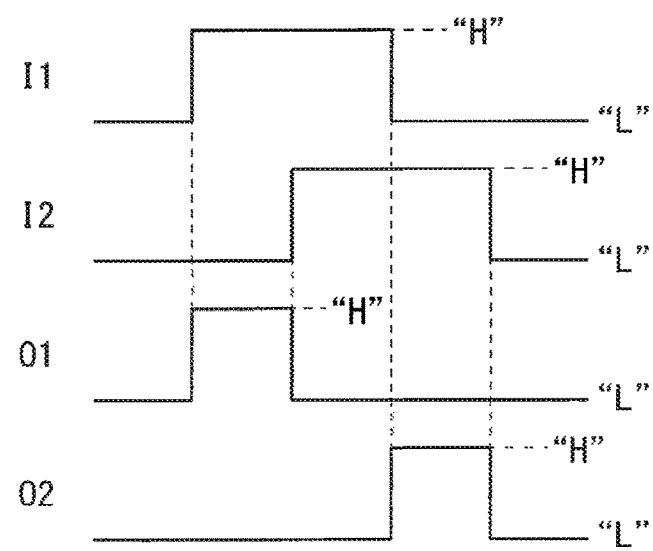

F I G. 1 3
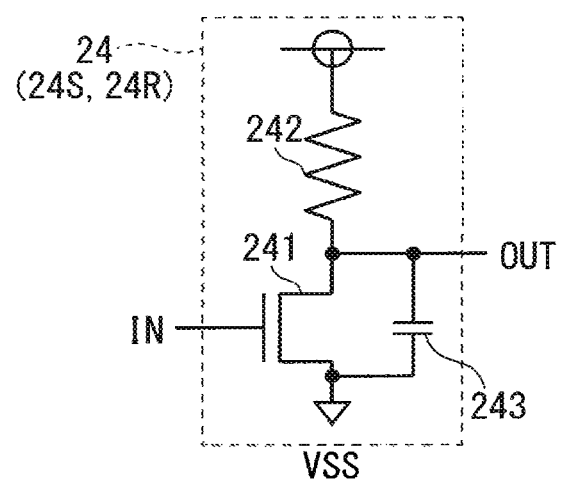

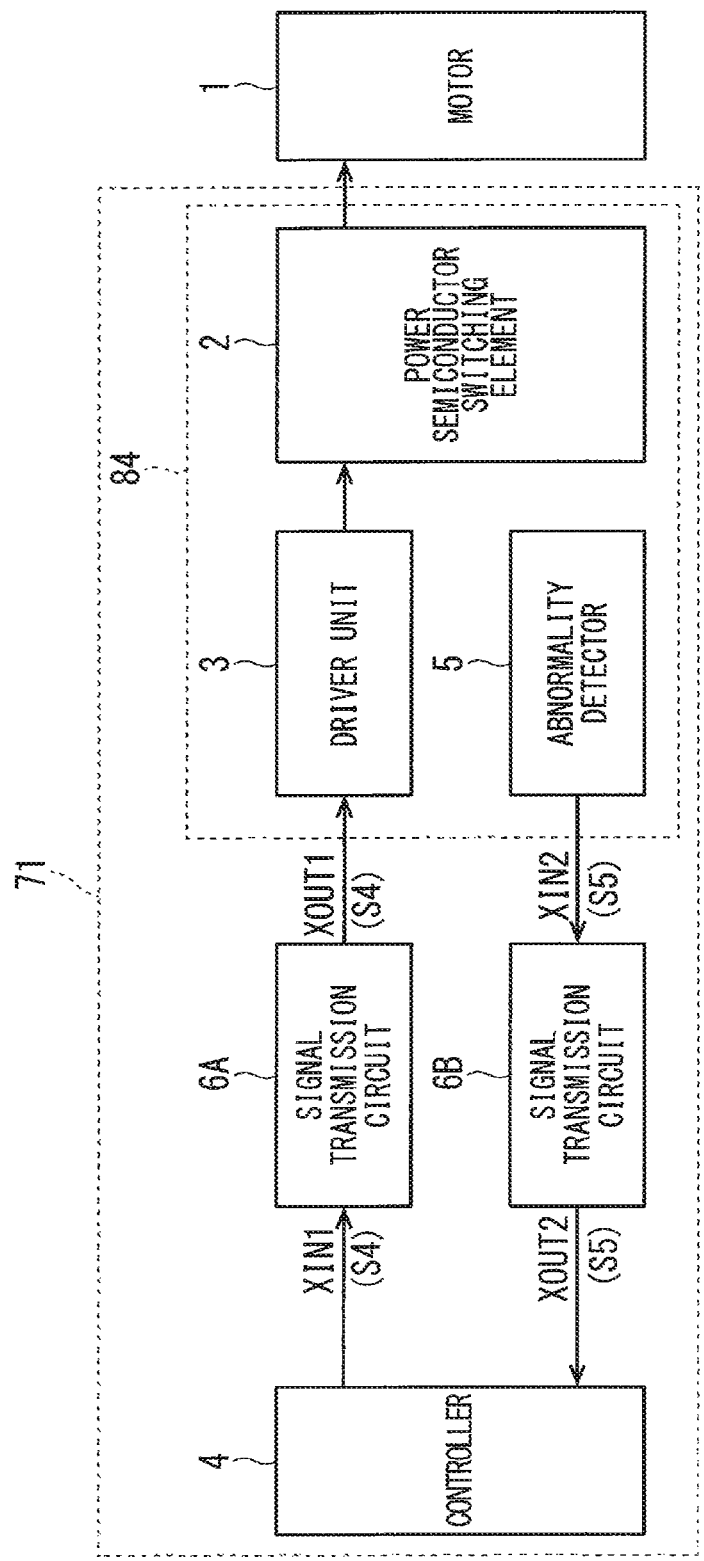
F I G. 17

SIGNAL TRANSMISSION CIRCUIT AND POWER CONVERSION DEVICE

TECHNICAL FIELD

The present invention relates to a signal transmission circuit that transmits a signal via a transformer and a power conversion device including the signal transmission circuit.

BACKGROUND ART

For example, in an inverter that drives a three-phase AC motor, a conventional signal transmission circuit used in a driving circuit device for a power semiconductor switching element in the inverter has the following arrangement.

The conventional signal transmission circuit transmits first and second input signals having different signal velocities while electrically insulating them, and includes a pulse generation unit, first and second transmission units, a latch circuit, and an oscillation determination circuit. The first and second transmission units transmit first and second pulse signals, generated by the pulse generation unit in accordance with the logical states of the first and second input signals, to the latch circuit and the oscillation determination circuit while electrically insulating the signals. The latch circuit obtains a first restoration output signal by restoring the first input signal in accordance with rising edges of the first and second pulse signals. The oscillation determination circuit obtains a second restoration output signal by restoring the second input signal on the basis of the oscillation states of the first and second pulse signals. A signal transmission circuit having such an arrangement is disclosed in, for example, Patent Document 1.

PRIOR ART DOCUMENTS

Patent Documents

Patent Document 1: Japanese Patent Application Laid-Open No. 2014-7502

SUMMARY

Problems to be Solved by the Invention

With the above arrangement of the conventional signal transmission circuit, when the ON (active level) pulse width of the first input signal is shorter than the timings of the first and second pulse signals generated by the pulse generation unit, there may occur a time period for which both the first and second pulse signals are set in the ON state. When the above time period occurs, both the input signals to the latch circuit are set in the ON state. In this state, output signals from the latch circuit, that is, the first and second restoration output signals, come into an unstable state in which their contents change depending on whether one of the input signals (first and second pulse signals) to the latch circuit operates earlier. This will lead to malfunction. Alternatively, a delay time occurs until one of the first and second pulse signals becomes OFF (inactive level).

As described above, the conventional signal transmission circuit has the problem of being incapable of outputting external output signals (first and second restoration output signals) accurately reflecting external input signals (first and second input signals).

The present invention has been made to solve to the above problem, and has an object to provide a signal transmission circuit that outputs external output signals accurately reflecting external input signals and a power conversion device including the signal transmission circuit.

Means to Solve the Problems

A signal transmission circuit according to claim 1 of the present invention includes a first circuit to output first and second transmission signals on the basis of an external input signal, first and second transformers to receive the first and second transmission signals on a primary side and obtain first and second transformer output signals on a secondary side, and a second circuit to generate an external output signal on the basis of the first and second transformer output signals, in which the external input signal has first and second logic levels, changes from the second logic level to the first logic level at a first transition time, and changes from the first logic level to the second logic level at a second transition time, the first circuit outputs the first and second transmission signals such that the first transmission signal changes between the first and second logic levels in a first period when the external input signal is at the first logic level, is fixed to the second logic level when the external input signal is at the second logic level, and is set at the first logic level for a predetermined period at the first transition time of the external input signal, and such that the second transmission signal changes between the first and second logic levels in a second period when the external input signal is at the second logic level, is fixed to the second logic level when the external input signal is at the first logic level, and is set at the first logic level for a predetermined period at the second transition time of the external input signal, and the second circuit includes first and second control protectors to invalidate the first and second transformer output signals for first and second mask periods on the basis of the first or second logic level of the external output signal, a first signal shaping circuit to receive the first transformer output signal via the first control protector and generate a first logic setting signal indicating an active level for a first logic setting period exceeding a period for which the first transformer output signal indicates an active level, a second signal shaping circuit to receive the second transformer output signal via the second control protector and generate a second logic setting signal indicating an active level for a second logic setting period exceeding a period for which the second transformer output signal indicates an active level, a logic setting signal control circuit to receive the first and second logic setting signals and invalidate indication of an active level by the first and second logic setting signals when both the first and second logic setting signals indicate an active level, and an output signal generation circuit to receive the first and second logic setting signals via the logic setting signal control circuit and generate the external output signal that is set at one logic level of first and second logic levels when the first logic setting signal indicates an active level, and set at the other logic level when the second logic setting signal indicates an active level.

Effects of the Invention

In the signal transmission circuit according to the present invention, the first circuit outputs the first and second transmission signals that change between the first and second logic levels in the first and second periods at the time when an external input signal is at the first and second logic levels in addition to the first and second transition times of the external input signal. This allows the second circuit to reliably detect changes of the external input signal from the second and first logics to the first and second logic levels as the first and second transformer output signals.

In addition, the first and second control protectors invalidate the first and second transformer output signals in the first and second mask periods on the basis of the first or second logic level of an external output signal. This makes it possible to improve the reliability of an external output signal generated by the output signal generation circuit by setting, in the first mask period, a period in which there is no need to detect that the external input signal has changed to the first logic level and also setting, in the second mask period, a period in which there is no need to detect that the external output signal has changed to the second logic level.

In addition, the first and second signal shaping circuits generate the first and second logic setting signals indicating an active level for the first and second logic setting periods exceeding periods for which the first and second transformer output signals indicate an active level. This allows the output signal generation circuit to generate an external output signal reliably reflecting the instruction contents of the first and second logic setting signals.

Furthermore, the logic setting signal control circuit invalidates the first and second logic setting signals when both the first and second logic setting signals indicate an active level. This makes it possible to reliably avoid a situation in which both the first and second logic setting signals are set at an active levels when the output signal generation circuit generates an external output signal, thus improving the reliability of the external output signal.

Therefore, the signal transmission circuit according to the present invention outputs an external output signal accurately reflecting an external input signal. This makes it possible to perform signal transmission with high reliability.

Objects, features, aspects, and advantages of the present invention will become more obvious in the following detailed description and the accompanying drawings.

BRIEF DESCRIPTION OF DRAWINGS

FIG. 11 is a circuit diagram showing the internal arrangement of a control circuit shown in FIG. 1.

FIG. 12 is a waveform chart showing operation waveforms concerning details on control performed by the control circuit shown in detail in FIG. 11.

FIG. 13 is a circuit diagram showing the internal arrangement of a buffer circuit shown in FIG. 4.

FIG. 17 is a block diagram showing an arrangement according to a first aspect in a power conversion device according to a third embodiment of the present invention.

DESCRIPTION OF EMBODIMENTS

First Embodiment (Overall Arrangement of Signal Transmission Circuit 6)

Figure 1:
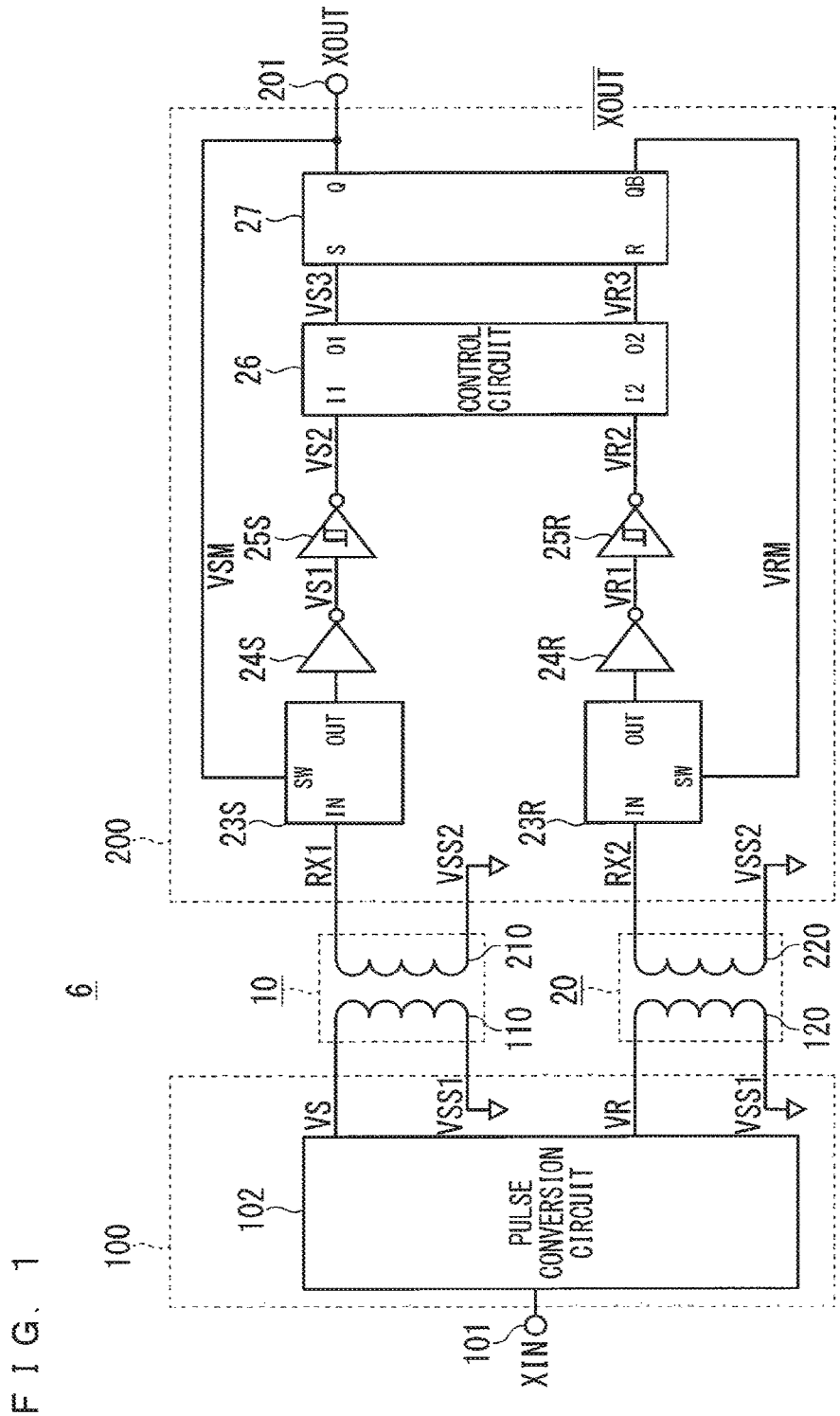
FIG. 1 is a block diagram showing the arrangement of a signal transmission circuit according to a first embodiment of the present invention.

FIG. 1 is a block diagram showing the overall arrangement of a signal transmission circuit 6 according to a first embodiment of the present invention. The signal transmission circuit 6 according to the first embodiment will be described below with reference to FIG. 1. In each embodiment described below, the same reference numerals denote the same constituent elements, and redundant descriptions will be omitted as needed.

As shown in FIG. 1, the signal transmission circuit 6 is constituted by a first circuit 100, a transformer 10 (first transformer), a transformer 20 (second transformer), and a second circuit 200.

The transformer 10 includes a coil 110 as a primary coil and a coil 210 as a secondary coil. The transformer 20 includes a coil 120 as a primary coil and a coil 220 as a secondary coil.

The first circuit 100 is electrically connected to the coil 110 of the transformer 10 and the coil 120 of the transformer 20. The second circuit 200 is electrically connected to the coil 210 of the transformer 10 and the coil 220 of the transformer 20.

The first circuit 100 transmits an input signal XIN (external input signal), externally received via an input terminal 101, to the second circuit 200 via the transformer 10 and the transformer 20, and outputs an output signal XOUT (external output signal) from an output terminal 201 of the second circuit 200 to the outside on the basis of induced voltage signals RX1 and RX2 from the transformers 10 and 20.

Accordingly, the signal transmission circuit 6 executes the signal transmission processing of receiving the input signal XIN and outputting the output signal XOUT reflecting the signal contents of the input signal XIN to the outside. That is, the output signal XOUT is a signal corresponding to the input signal XIN.

The connection relationship between the transformer 10 and the first and second circuits 100 and 200 will be described. The first end of the coil 110 is connected to the first output terminal (for a transmission signal VS) of the first circuit 100. The first circuit 100 sets the second end of the coil 110 at a reference potential VSS1. The first end of the coil 210 is connected to the first input terminal (for the induced voltage signal RX1) of the second circuit 200. The second circuit 200 sets the second end of the coil 210 at a reference potential VSS2.

The connection relationship between the transformer 20 and the first and second circuits 100 and 200 will be described. The first end of the coil 120 is connected to the second output terminal (for a transmission signal VR) of the first circuit 100. The second end of the coil 120 is set at the reference potential VSS1 of the first circuit 100. The first end of the coil 220 is connected to the second input terminal (for the induced voltage signal RX2) of the second circuit 200. The second circuit 200 sets the second end of the coil 220 at the reference potential VSS2.

The first circuit 100 includes a pulse conversion circuit 102 as a main component. The pulse conversion circuit 102 outputs the transmission signal VS (first transmission signal) and the transmission signal VR (second transmission signal), obtained on the basis of the input signal XIN received via the input terminal 101, to the first end of the coil 110 and the first end of the coil 120 respectively connected to the first and second output terminals.

Although described in detail later, the pulse conversion circuit 102 uses a first clock signal obtained as an AND between the input signal XIN and an oscillation signal from an oscillator in order to outputs, as the transmission signal VS, a first pulse signal obtained as an OR between the signal obtained by detecting a rising edge of the input signal XIN and the first clock signal to the first end of the coil 110.

In addition, the pulse conversion circuit 102 uses a second clock signal obtained as an AND between the signal obtained by inverting the input signal XIN and an oscillation signal from the oscillator in order to output, as the transmission signal VR, a second pulse signal obtained as an OR between the signal obtained by detecting a falling edge of the input signal XIN and the second clock signal to the first end of the coil 120.

Accordingly, the transformer 10 receives, on the primary side, the transmission signal VS (first transmission signal) on the first output terminal of the first circuit 100, and obtains, on the secondary side, the induced voltage signal RX1 (first transformer output signal) at the first input terminal of the second circuit 200.

Likewise, the transformer 20 receives, on the primary side, the transmission signal VR (second transmission signal) on the second output terminal of the first circuit 100, and obtains, on the secondary side, the induced voltage signal RX2 (second transformer output signal) at the second input terminal of the second circuit 200.

The second circuit 200 is constituted by control protection elements 23S and 23R, buffer circuits 24S and 24R, Schmitt circuits 25S and 25R, a control circuit 26, and a latch circuit 27. The first and second input terminals of the second circuit 200 are respectively connected to the first end of the coil 210 of the transformer 10 and the first end of the coil 220 of the transformer 20.

The control protection element 23S includes an input portion IN, an output portion OUT, and a control input portion SW. The input portion IN receives the induced voltage signal RX1 from the first input terminal of the second circuit 200. The control input portion SW receives the output signal XOUT from the latch circuit 27 as a control signal VSM. The control protection element 23S outputs the induced voltage signal RX1 from the output portion OUT without any change in a period other than a first mask period for which the control signal VSM indicates "H". Note, however, that the control protection element 23S forcibly invalidates the induced voltage signal RX1 in the first mask period, and the output portion OUT is fixed to "L".

Likewise, the control protection element 23R includes an input portion IN, an output portion OUT, and a control input portion SW. The input portion IN receives the induced voltage signal RX2 from the second input terminal of the second circuit 200. The control input portion SW receives an inverted output signal $\overline{\text{XOUT}}$ from the latch circuit 27 as a control signal VRM. The control protection element 23R outputs the induced voltage signal RX2 from the output portion OUT without any change in a period other than a second mask period for which the control signal VRM indicates "H". Note, however, that the control protection element 23R forcibly invalidates the induced voltage signal RX2 in the second mask period, and the output portion OUT is fixed to "L".

In this manner, the control protection elements 23S and 23R invalidate the induced voltage signals RX1 and RX2 (first and second transformer output signals) in the first and second mask periods.

The buffer circuit 24S obtains a signal VS1 by inverting and amplifying the induced voltage signal RX1 obtained via the control protection element 23S. The Schmitt circuit 25S obtains a signal VS2 by shaping the waveform of the signal VS. In obtaining an inverted signal of the signal VS1 as the signal VS2, the above waveform shaping processing is the processing of generating the signal VS2 (first logic setting signal) indicating "H" (active level) for a period (first logic setting period) exceeding a period for which the signal VS1 indicates "L" (active level).

The buffer circuit 24R obtains a signal VR1 by inverting and amplifying the induced voltage signal RX2 obtained via the control protection element 23R. The Schmitt circuit 25R obtains a signal VR2 by shaping the waveform of the signal VR1. In obtaining an inverted signal of the signal VR1 as the signal VR2, the above waveform shaping processing is the processing of generating the signal VR2 (second logic setting signal) indicating "H" (active level) for a period (second logic setting period) exceeding a period for which the signal VR1 indicates "L" (active level).

Accordingly, the buffer circuit 24S and the Schmitt circuit 25S function as a first signal shaping circuit. The first signal shaping circuit receives the induced voltage signal RX1 (first transformer output signal) via the control protection element 23S (first control protector). When the induced voltage signal RX1 is not invalidated by the control protection element 23S, this circuit generates the signal VS2 (first logic setting signal) indicating "H" (active level) for the first logic setting period exceeding a period for which the induced voltage signal RX1 indicates "H" (active level).

Likewise, the buffer circuit 24R and the Schmitt circuit 25R function as a second signal shaping circuit. The second signal shaping circuit receives the induced voltage signal RX2 (second transformer output signal) via the control protection element 23R (second control protector). When the induced voltage signal RX2 is not invalidated by the control protection element 23R, this circuit generates the signal VR2 (second logic setting signal) indicating "H"

(active level) for the second logic setting period exceeding a period for which the induced voltage signal RX2 indicates "H" (active level).

The control circuit 26 receives the signals VS2 and VR2 (first and second logic setting signals). When both the signals VS2 and VR2 indicate "H" (active level), the control circuit 26 invalidates "H" of the signals VS2 and VR2, and outputs "L" signals VS3 and VR3.

In contrast, when at least one of the signals VS2 and VR2 is set at "L", the control circuit 26 outputs the signals VS2 and VR2 as the signals VS3 and VR3, without any change, to a set input portion S and a reset input portion R of the latch circuit 27.

The latch circuit 27 as an output signal generation circuit receives the signals VS3 and VR3 via the control circuit 26 (logic setting signal control circuit). In this case, when the control circuit 26 has not performed invalidation processing with respect to the signals VS2 and VR2, the signals VS3 and VR3 become the signals VS2 and VR2 (first and second logic setting signals).

Accordingly, the latch circuit 27 receives the signals VS3 and VR3. When the signal VS3 (=VS2) indicates "H" (active level), the latch circuit 27 is set at "H" (one of logic levels "H" and "L"). When the signal VR3 (=VR2) indicates "H" (active level), the latch circuit 27 is set at "L" (the other of logic levels "H" and "L"). The latch circuit 27 generates the output signal XOUT (external output signal) and outputs it from an output portion Q. In addition, the latch circuit 27 outputs the inverted output signal $\overline{\text{XOUT}}$ as an inverted signal of the output signal XOUT together with the output signal XOUT from an inverting output portion QB.

(Power Conversion Device 60 Including Signal Transmission Circuit 6)

Figure 2:
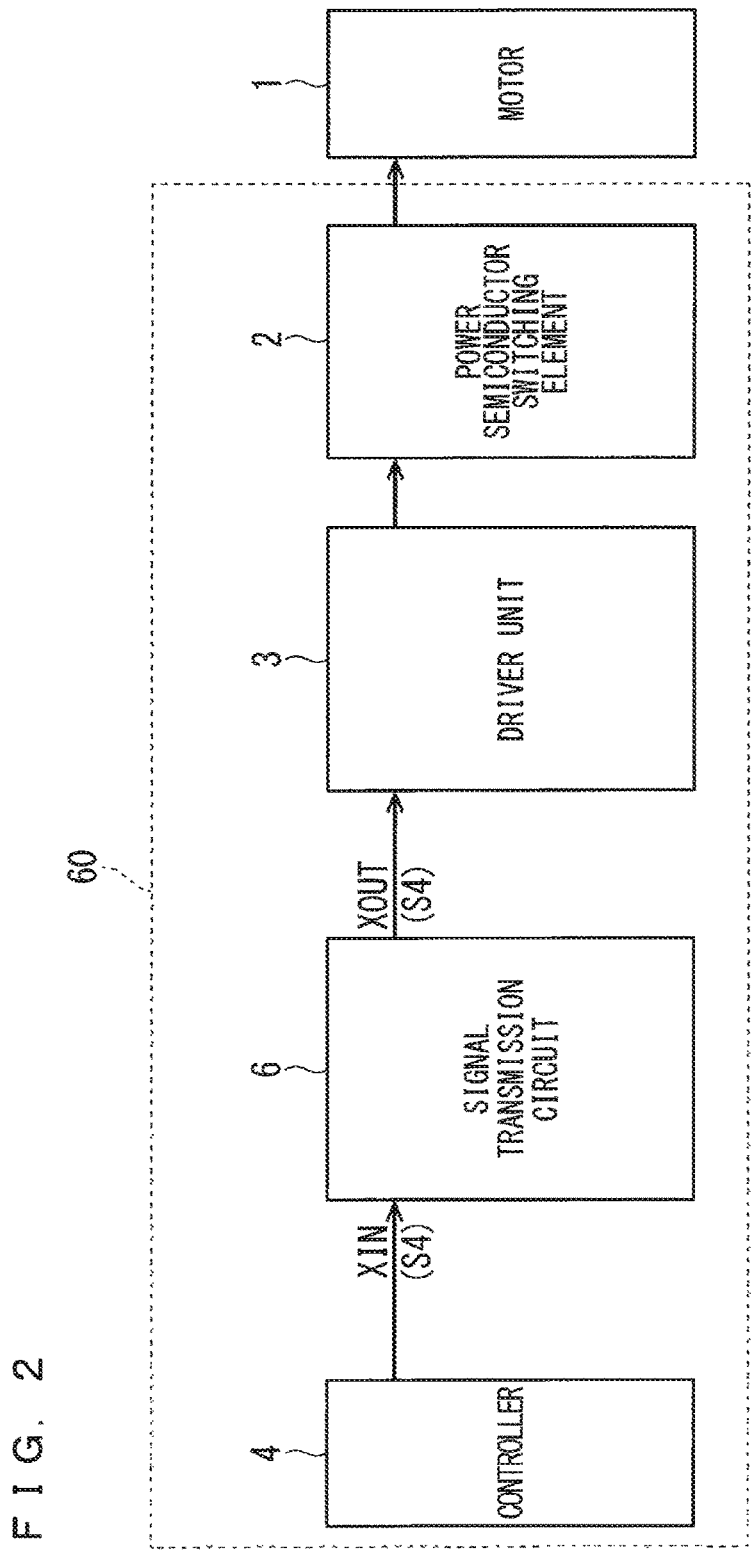
FIG. 2 is a block diagram showing the overall arrangement of a power conversion device including the signal transmission circuit according to the first embodiment.

FIG. 2 is a block diagram showing the overall arrangement of the power conversion device 60 including the signal transmission circuit 6 according to the first embodiment. As shown in FIG. 2, the signal transmission circuit 6 according to the first embodiment is used to transmit a control signal S4 for performing drive control of a power semiconductor switching element 2 (power semiconductor switching element) such as an IGBT in the power conversion device 60.

That is, the power conversion device 60 provided to control a motor 1 used in a hybrid vehicle, electric vehicle, or the like includes the power semiconductor switching element 2, a driver unit 3 as a driving circuit that drives the power semiconductor switching element 2, a controller 4 that generates a control signal S4 for the driver unit 3 to cause the driver unit 3 to drive the power semiconductor switching element 2, and the signal transmission circuit 6 according to the first embodiment, which receives the control signal S4 from the controller 4 as the input signal XIN and transmits it as the output signal XOUT to the driver unit 3.

The signal transmission circuit 6 is provided between the controller 4 and the driver unit 3. This allows the signal transmission circuit 6 to receive the control signal S4 from the controller 4 as the input signal XTN, generate the output signal XOUT corresponding to the control signal S4, and output it to the driver unit 3 while insulating the controller 4 from devices to be controlled by high voltages, such as the driver unit 3, the power semiconductor switching element 2, and the motor 1.

(Signal Transmission Processing by Signal Transmission Circuit 6)

Figure 3:
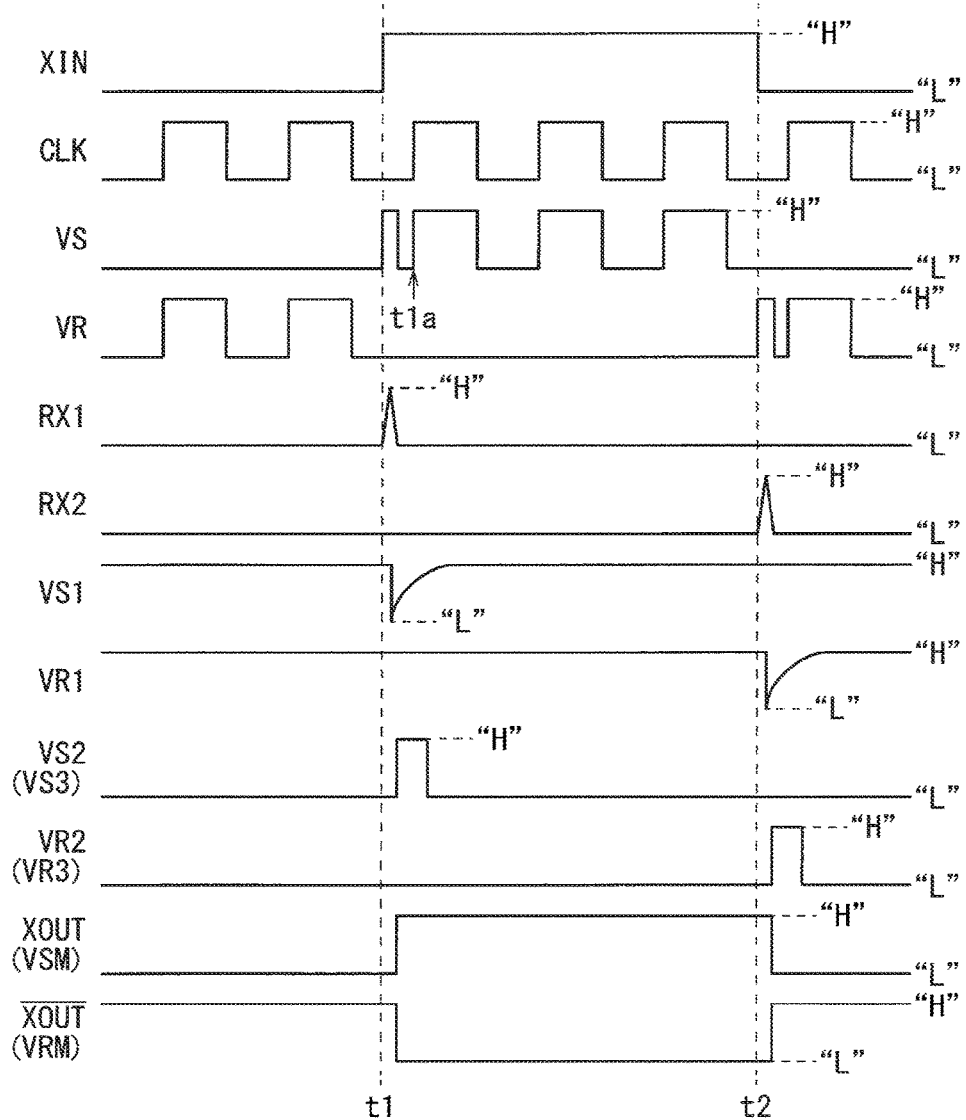
FIG. 3 is a waveform chart showing operation waveforms in signal transmission processing by the signal transmission circuit according to the first embodiment.

FIG. 3 is a waveform chart showing operation waveforms in signal transmission processing by the signal transmission circuit 6 according to the first embodiment of the present invention.

FIG. 3 shows the operation waveforms of the input signal XIN input to the signal transmission circuit 6, an oscillation signal CLK in the first circuit 100, the transmission signal VS that is the first pulse signal transmitted from the first circuit 100 to the first end of the coil 110, and the transmission signal VR that is the second pulse signal transmitted from the first circuit 100 to the first end of the coil 120. These signals are those associated with the first circuit 100 including the pulse conversion circuit 102.

In addition, FIG. 3 shows the operation waveforms of the induced voltage signal RX1 generated at the first end of the coil 210 and received by the second circuit 200, the induced voltage signal RX2 generated at the first end of the coil 220 and received by the second circuit 200, the signal VS1 that is an output signal from the buffer circuit 24S, the signal VR1 that is an output signal from the buffer circuit 24R, the signal VS2 that is an output signal from the Schmitt circuit 25S, and the signal VR2 that is an output signal from the Schmitt circuit 25R.

Furthermore, FIG. 3 shows the operation waveforms of the signal VS3 that is an input signal to the set input portion S of the latch circuit 27, the signal VR3 that is an input signal to the reset input portion R of the latch circuit 27, the output signal XOUT (=control signal VSM) from the signal transmission circuit 6, which is an output signal from a (non-inverting) output portion Q of the latch circuit 27, and the inverted output signal $\overline{\text{XOUT}}$ (=control signal VRM) that is an output signal from the inverting output portion QB of the latch circuit 27.

The detailed arrangement and operation of each unit in the signal transmission circuit 6 will be described below.

(Arrangement of Each Unit in Signal Transmission Circuit 6)

Figure 4:
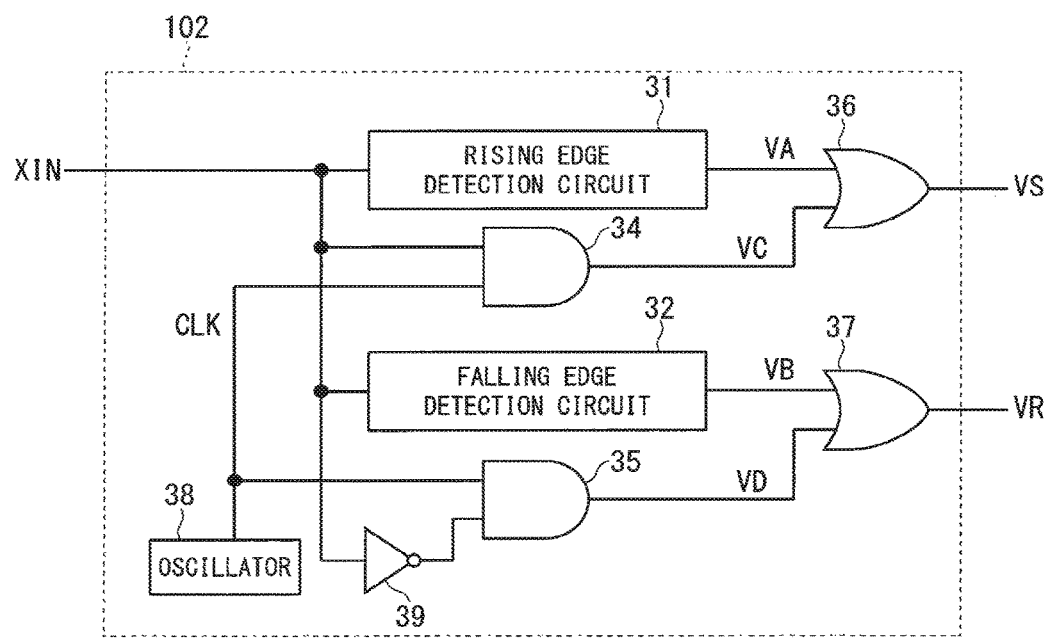
FIG. 4 is a block diagram showing the internal arrangement of a pulse conversion circuit as a component of a first circuit of the signal transmission circuit according to the first embodiment.
Figure 5:
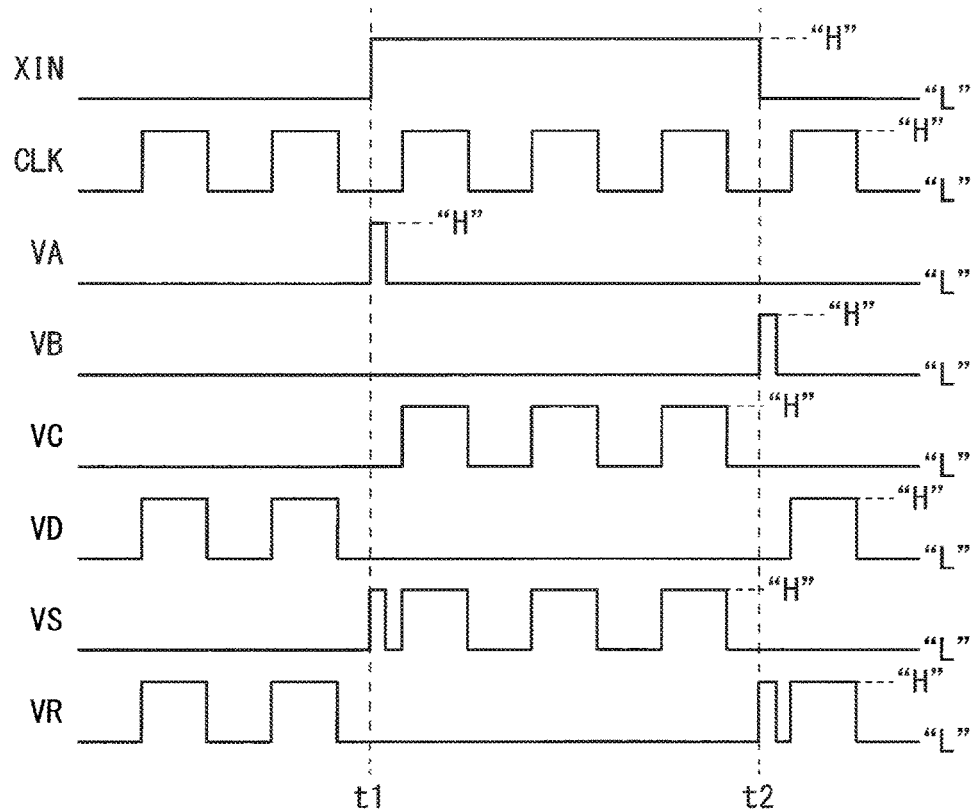
FIG. 5 is a waveform chart showing operation waveforms in a pulse conversion operation by the pulse conversion circuit shown in FIG. 4.

FIG. 4 is a block diagram showing the internal arrangement of the pulse conversion circuit 102 as a component part of the first circuit 100 of the signal transmission circuit 6. FIG. 5 is a waveform chart showing operation waveforms in the pulse conversion operation of the pulse conversion circuit 102. Note that the arrangement of the pulse conversion circuit 102 shown in FIG. 4 is merely an example and is not exhaustive.

As shown in FIG. 4, the pulse conversion circuit 102 includes a rising edge detection circuit 31, a falling edge detection circuit 32, an oscillator 38, two AND gates 34 and 35, two OR gates 36 and 37, and an inverter 39. The input signal XIN input to the pulse conversion circuit 102 is supplied to the rising edge detection circuit 31, the falling edge detection circuit 32, one input of the AND gate 34, and the input portion of the inverter 39.

The oscillation signal CLK from the oscillator 38 is supplied to the other input of the AND gate 34 and one input of the AND gate 35. An output signal from the inverter 39 is supplied to the other input of the AND gate 35. An output signal VA from the rising edge detection circuit 31 is supplied to one input of the OR gate 36. An output signal VC from the AND gate 34 is supplied to the other input of the OR gate 36. An output signal VB from the falling edge detection circuit 32 is supplied to one input of the OR gate 37. An output signal VD from the AND gate 35 is supplied to the other input of the OR gate 37.

As shown in FIG. 5, in the pulse conversion circuit 102, when the logical value of the input signal XIN changes from "L" to "H" (first transition time), the rising edge detection circuit 31 outputs the signal VA having an "H" pulse with a predetermined period width accordingly. In addition, when the logical value of the input signal XIN changes from "H" to "L" (second transition time), the falling edge detection circuit 32 outputs the signal VB having an "H" pulse with a predetermined period width accordingly.

The oscillator 38 outputs the oscillation signal CLK having a predetermined period. The AND gate 34 outputs the signal VC that is the AND between the input signal XIN and the oscillation signal CLK. The AND gate 35 outputs the signal VD that is the AND between the input signal XIN and an inverted signal of the oscillation signal CLK. The signals VA and VC are supplied to the OR gate 36, and an output signal from the OR gate 36 becomes the transmission signal VS output from the pulse conversion circuit 102. The signals VB and VD are supplied to the OR gate 37, and an output signal from the OR gate 37 becomes the transmission signal VR output from the pulse conversion circuit 102.

Accordingly, the input signal XIN (external input signal) is a signal having "H" and "L" (first and second logic levels), which changes from "L" to "H" at the first transition time, and changes from "H" to "L" at the second transition time.

In addition, the transmission signal VS (first transmission signal) is a signal that changes between "H" and "L" in a period (first period) of the oscillation signal CLK when the input signal XIN is set at "H", is fixed to "L" when the input signal XIN is set at "L", and is set at "H" for a predetermined period at the first transition time of the input signal XIN.

Likewise, the transmission signal VR (second transmission signal) is a signal that changes between "H" and "L" in a period (second period (=first period)) of the oscillation signal CLK when the input signal XIN is set at "L", is fixed to "L" when the input signal XIN is set at "H", and is set at "H" for a predetermined period at the second transition time of the input signal XIN.

Figure 6:
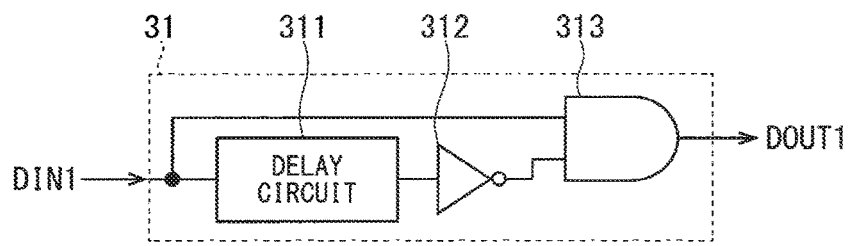
FIG. 6 is a circuit diagram showing the internal arrangement of a rising edge detection circuit shown in FIG. 4.
Figure 7:
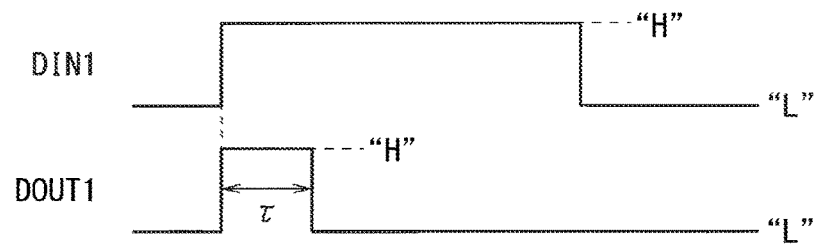
FIG. 7 is a waveform showing operation waveforms in detection processing by the rising edge detection circuit shown in detail in FIG. 6.

FIG. 6 is a circuit diagram showing the internal arrangement of the rising edge detection circuit 31 shown in FIG. 4. FIG. 7 is a waveform chart showing operation waveforms in detection processing by the rising edge detection circuit 31. Note that the arrangement of the rising edge detection circuit 31 shown in FIG. 6 is merely an example and is not exhaustive.

As shown in FIG. 6, the rising edge detection circuit 31 is constituted by a delay circuit 311, an inverter 312, and an AND gate 313. A signal DIN1 input to the rising edge detection circuit 31 is supplied to the input portion of the delay circuit 311 and one input of the AND gate 313. The signal DIN1 input to the delay circuit 311 is delayed by a predetermined period (indicated by "τ" in FIG. 7) and supplied to the other input of the AND gate 313 via the inverter 312. An output signal from the AND gate 313 becomes an output signal DOUT1 from the rising edge detection circuit 31.

As shown in FIG. 7, the rising edge detection circuit 31 outputs the signal DOUT1 having an "H" pulse width for the predetermined period τ when the input signal DIN1 changes from "L" and "H".

Accordingly, the rising edge detection circuit 31 shown in FIG. 4 can output the signal VA having the "H" pulse width corresponding to the predetermined period t at the first transition time when the input signal XIN changes from "L" to "H".

Figure 8:
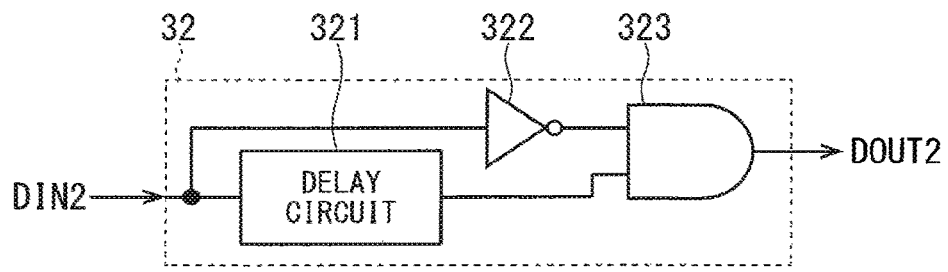
FIG. 8 is a circuit diagram showing the internal arrangement of a falling edge detection circuit shown in FIG. 4.
Figure 9:
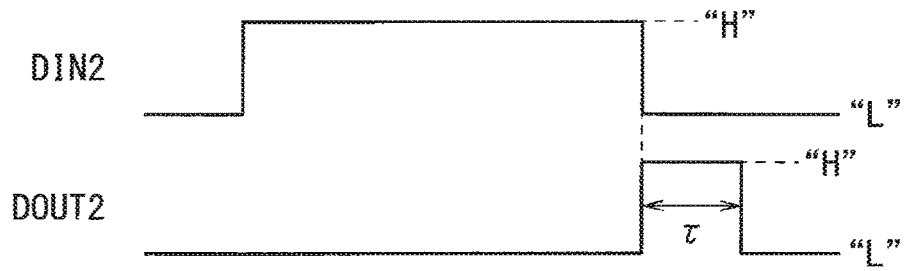
FIG. 9 is a waveform chart showing operation waveforms in detection processing by the falling edge detection circuit shown in detail in FIG. 8.

FIG. 8 is a circuit diagram showing the internal arrangement of the falling edge detection circuit 32 shown in FIG. 4. FIG. 9 is a waveform chart showing operation waveforms in detection processing by the falling edge detection circuit 32. Note that the arrangement of the falling edge detection circuit 32 shown in FIG. 8 is merely an example and is not exhaustive.

As shown in FIG. 8, the falling edge detection circuit 32 is constituted by a delay circuit 321, an inverter 322, and an AND gate 323. A signal DIN2 supplied to the falling edge detection circuit 32 is supplied to the input portion of the delay circuit 321 and the input portion of the inverter 322. An output signal from the inverter 322 is supplied to one input of the AND gate 323.

The signal DIN2 input to the delay circuit 321 is delayed by the predetermined period τ and supplied to the other input of the AND gate 323. An output signal from the AND gate 323 becomes an output signal DOUT2 from the falling edge detection circuit 32.

As shown in FIG. 9, the falling edge detection circuit 32 outputs the signal DOUT2 having an "H" pulse width for the predetermined period τ when the input signal DIN2 changes from "H" to "L".

Accordingly, the falling edge detection circuit 32 shown in FIG. 4 can output the signal VB having an "H" pulse width corresponding to the predetermined period τ at the second transition time described above when the input signal XIN changes from "H" to "L".

Figure 10:
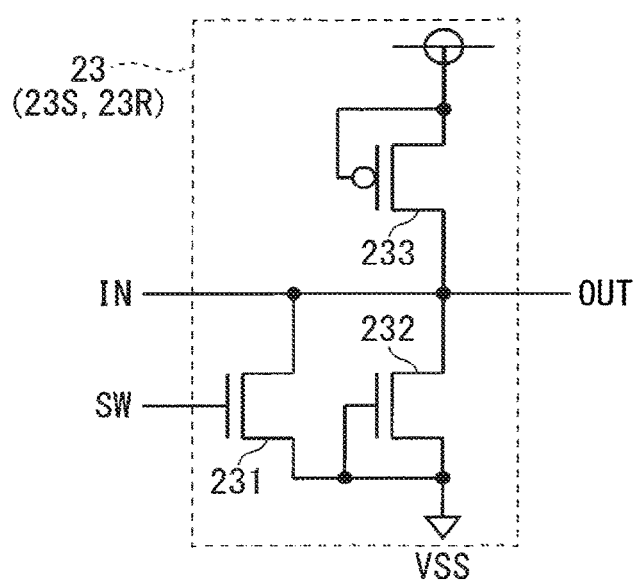
FIG. 10 is a circuit diagram showing the internal arrangement of a control protection element shown in FIG. 1.

FIG. 10 is a circuit diagram showing the internal arrangement of a control protection element 23 (23S, 23R). Note that the control protection element 23 has a circuit arrangement common to each of the control protection elements 23S and 23R. In addition, the arrangement of the control protection element 23 shown in FIG. 10 is merely an example and is not exhaustive.

As shown in FIG. 10, the control protection element 23 includes two NMOS transistors 231 and 232 and a PMOS transistor 233. An input portion IN of the control protection element 23 is commonly connected to the drain (terminal) of the NMOS transistor 231, the drain of the NMOS transistor 232, and the drain of the PMOS transistor. An output portion OUT of the control protection element 23 is connected to the input portion IN. A control input portion SW of the control protection element 23 is connected to the gate (terminal) of the NMOS transistor 231. The source (terminal) of the NMOS transistor 231 is set at a reference potential VSS. The gate and source of the NMOS transistor 232 are also set at the reference potential VSS. On the other hand, the gate and source of the PMOS transistor 233 are set at a power supply potential VDD. Note that the control protection element 23 is a surge protection element whose gate potential is fixed, and uses part (the NMOS transistor 231 in this case) of the surge protection element while controlling its operation.

In the control protection element 23, when a control signal (VSM, VRM) obtained from the control input portion SW indicates "H", the NMOS transistor 231 is turned on to fix the output portion OUT to "L" and invalidate a signal obtained from the input portion IN. When the control signal indicates "L", the NMOS transistor 231 is turned off to allow a signal obtained from the input portion IN to be output from the output portion OUT without any change.

Accordingly, the control protection element 23S can invalidate the induced voltage signal RX1 for a period, as the first mask period, for which the control signal VSM (=output signal XOUT) obtained from the control input portion SW indicates "H" (first logic level).

Likewise, the control protection element 23R can invalidate the induced voltage signal RX2 for a period, as the second mask period, for which the control signal VRM (=inverted output signal $\overline{\text{XOUT}}$) obtained from the control input portion SW indicates "H", that is, the output signal XOUT indicates "L" (second logic level).

Note that the control protection elements 23S and 23R output the induced voltage signals RX1 and RX2 without any change to the input portions of the buffer circuits 24S and 24R on the subsequent stage when the control signals VSM and VRM are at "L".

FIG. 11 is a circuit diagram showing the internal arrangement of the control circuit 26. FIG. 12 is a waveform chart showing operation waveforms concerning details on control performed by the control circuit 26. Note that the arrangement of the control circuit 26 shown in FIG. 11 is merely an example and is not exhaustive.

As shown in FIG. 11, the control circuit 26 includes two AND gates 261 and 262 and a NAND gate 263. An input signal I1 is supplied to one input of the AND gate 261 and one input of the NAND gate 263. An input signal I2 is supplied to one input of the AND gate 262 and the other input of the NAND gate 263. The other input of the AND gate 261 and the other input of the AND gate 262 receive an output signal from the NAND gate 263.

As shown in FIG. 12, the control circuit 26 prevents the occurrence of a state in which the input signals I1 and I2 are simultaneously set at "H", and outputs output signals O1 and O2 respectively corresponding to the input signals I1 and I2. That is, the control circuit 26 outputs the input signals I1 and I2 as the output signals O1 and O2 without any change when at least one of the input signals I1 and I2 is set at "L", and fixes the output signals O1 and O2 to "L" when both the input signals I1 and I2 are set at "H".

In this manner, upon receiving the signals VS2 and VR2 (first and second logic setting signals) as the input signals I1 and I2, the control circuit 26 invalidates the indication of "H" of the signals VS2 and VR2 when both the signals VS2 and VR2 at "H" (active level), and outputs the "L" signals VS3 and VR3.

Note that when at least one of the signals VS2 and VR2 is set at "L", the signals VS2 and VR2 are output as the signals VS3 and VR3 without any change.

FIG. 13 is a circuit diagram showing the internal arrangement of a buffer circuit 24 (24S and 24R). Note that the buffer circuit 24 has a circuit arrangement common to both the buffer circuit 24S and the buffer circuit 24R. In addition, the arrangement of the buffer circuit 24 shown in FIG. 13 is merely an example and is not exhaustive.

As shown in FIG. 13, the buffer circuit 24 includes an NMOS transistor 241, a resistor 242, and a capacitor 243. An input signal IN is supplied to the gate of the NMOS transistor 241. The drain of the NMOS transistor 241 is connected to the second end of the resistor 242, and the source is connected to the reference potential VSS. The first end of the resistor 242 is set at the power supply potential VDD. One electrode of the capacitor 243 is connected to the second end of the resistor 242 and the drain of the NMOS transistor 241. The other electrode of the capacitor 243 is set at the reference potential VSS. A signal obtained from one electrode of the capacitor 243 is an output signal OUT.

The buffer circuit 24 having the above arrangement is an amplifier that outputs the output signal OUT by inverting the input signal IN. Setting constants for the resistor 242 and the capacitor 243 will determine the time it takes for the output signal OUT to return to the power supply potential VDD.

(Operation of Signal Transmission Circuit 6)

The overall operation of the signal transmission circuit 6 will be described next with reference to FIG. 3. As described above, the signal transmission circuit 6 includes the transformer 10 having the coil 110 and the coil 210, the transformer 20 having the coil 120 and the coil 220, the first circuit 100 connected to the coil 110 and the coil 120, and the second circuit 200 connected to the coil 210 and the coil 220. The signal transmission circuit 6 transmits the input signal XIN, supplied to the first circuit 100, as the induced voltage signals RX1 and RX2, to the second circuit 200 via the transformer 10 and the transformer 20, and outputs the output signal XOUT from the second circuit 200.

Time t1 is the first transition time when the input signal XIN input to the pulse conversion circuit 102 of the first circuit 100 changes from "L" to "H". The pulse conversion circuit 102 outputs the "H" pulse transmission signal VS to the first end of the coil 110 when the input signal XIN changes from "L" to "H". Note that in the period from time t1 to time t2 for which the input signal XIN is at "H", the transmission signal VS is output, which is obtained by ORing the signal obtained by detecting a rising edge of the input signal XIN and the oscillation signal CLK from the control circuit 26.

When the transmission signal VS changes from "L" to "H" at time t1 as a starting point, a current change occurs in the coil 110, and the induced voltage signal RX1, induced by the current change, is output to the first end of the coil 210. Assume that the induced voltage signal RX1 is supplied to the control protection element 23S, and the control signal VSM (=output signal XOUT) supplied to the control input portion SW of the control protection element 23S is at "L". In this case, the induced voltage signal RX1 is output to the buffer circuit 24S on the subsequent stage without any change in state.

The induced voltage signal RX1 input to the buffer circuit 24S via the control protection element 23S is output as the signal VS1 as an amplified inverted signal. The output signal VS1 from the buffer circuit 24S is input to the Schmitt circuit 25S, and the waveform-shaped signal VS2 changes from "L" to "H".

The output signal VS2 from the Schmitt circuit 25S is input to an input terminal I1 of the control circuit 26. At this time, because the input signal VR2 to an input terminal I2 of the control circuit 26 is at "L", the output signal VS3 from the output terminal O1 of the control circuit 26 is output in the same state as that of the input signal VS2. In addition, when the output signal VS3 from the control circuit 26 (the input signal to the set input portion S of the latch circuit 27) changes from "L" to "H", an output signal from the (non-inverting) output portion Q of the latch circuit 27 changes from "L" to "H" and is output as the output signal XOUT from the signal transmission circuit 6.

In this case, the output signal from the output portion Q of the latch circuit 27 is supplied, as the control signal VSM for the control protection element 23S, to the control input portion SW. When the control signal VSM changes from "L" to "H", the input terminal IN of the control protection element 23S is connected to the reference potential VSS2. As a consequence, the induced voltage signal RX1 is set at the same potential as the reference potential VSS2 and invalidated.

Note that in a period until time t1, because the state of the inverted output signal $\overline{\text{XOUT}}$ as an output signal from the inverting output portion QB of the latch circuit 27 is at "H", the input terminal IN of the control protection element 23R is connected to the reference potential VSS2 until the control signal VRM supplied to the control input portion SW of the control protection element 23R, that is, an output signal from the inverting output portion QB of the latch circuit 27, changes from "L" to "H". As a consequence, the induced voltage signal RX2 is set at the same potential as the reference potential VSS2 and invalidated.

Time t2 is the second transition time when the input signal XIN input to the pulse conversion circuit 102 of the first circuit 100 changes from "H" to "L". When the input signal XIN changes from "H" to "L", the pulse conversion circuit 102 outputs the "H" pulse transmission signal VR to the first end of the coil 120. Note that in a period after time t2, for which the input signal XIN is at "L", the pulse conversion circuit 102 outputs the transmission signal VR obtained by ORing the signal obtained by detecting a falling edge of the input signal XIN and the oscillation signal CLK from the oscillator 38.

When the transmission signal VR changes from "L" to "H", a current change occurs in the coil 120, and the induced voltage signal RX2, induced by the current change, is output to the first end of the coil 220. Assume that the induced voltage signal RX2 is input to the control protection element 23R, and the control signal VRM supplied to the control input portion SW of the control protection element 23R is at "L". In this case, the induced voltage signal RX2 is output to the buffer circuit 24R on the subsequent stage without any change in state.

The induced voltage signal RX2 input to the buffer circuit 24R via the control protection element 23R is output as the signal VR1 as an amplified inverted signal. The output signal VR1 from the buffer circuit 24R is input to the Schmitt circuit 25R, and the waveform-shaped signal VR2 changes from "L" to "H". The output signal VR2 from the Schmitt circuit 25R is input to the input terminal I2 of the control circuit 26. At this time, because the input signal VS2 to the input terminal I1 of the control circuit 26 is at "L", the output signal VR3 is output from the output terminal O2 of the control circuit 26 in the same state as that of the input signal VR2.

In addition, when the output signal VR3 from the control circuit 26 (the input signal to the reset input portion R of the latch circuit 27) changes from "L" to "H", an output signal from the output portion Q of the latch circuit 27 changes from "H" to "L" and is output as the output signal XOUT from the signal transmission circuit 6. Assume that the inverted output signal $\overline{\text{XOUT}}$ that is an output signal from the inverting output portion QB of the latch circuit 27 is supplied as the control signal VRM to the control input portion SW of the control protection element 23R, and the control signal VRM changes from "L" to "H". In this case, the input terminal IN of the control protection element 23R is connected to the reference potential VSS2, and the induced voltage signal RX2 is set at the same potential as the reference potential VSS2 and invalidated.

In this manner, in the signal transmission circuit 6 according to the first embodiment, the first circuit 100 outputs a plurality of pulse signals (transmission signals VS and VR) to the first end of the coil 110 and the first end of the coil 120 in accordance with a change in the logical value of the input signal XIN and the oscillation signal CLK from the oscillator. This allows the signal transmission circuit 6 to quickly recover even when the second circuit 200 malfunctions due to noise, thereby transmitting signals with high reliability.

That is, the first circuit 100 allows the second circuit 200 to reliably detect, as the induced voltage signals RX1 and RX2 (first and second transformer output signals), a change in the input signal XIN from "L" to "H" or from "H" to "L" when the transmission signals VS and VR are output, which change between "H" and "L" in periods of the oscillation signal CLK (first and second periods) in periods for which the input signal XIN is set at "H" and "L", in addition to the first and second transition times of the input signal XIN.

More specifically, even if the second circuit 200 fails to detect an "H" rising edge of the induced voltage signal RX1 at time t1, because the signal RX1 rises again at a rising edge time of the first pulse signal VS immediately after time t1 (for example, a rising edge time t1a based on the signal CLK), the second circuit 200 can output the almost normal output signal XOUT even through its pulse width shortens a little. In this case, because the output signal XOUT (control signal VSM) is kept at "L" until time t1a, the control protection element 23S does not invalidate the induced voltage signal RX1 that occurs immediately after time t1a.

In addition, the induced voltage signals RX1 and RX2 are respectively transmitted to the buffer circuits 24S and 24R on the subsequent stages, while each being connected to the reference potential VSS to be invalidated, in first and second mask periods, which are unnecessary detection periods, by using the control protection elements 23S and 23R of the second circuit 200.

The induced voltage signal RX1 from the coil 210 and the induced voltage signal RX2 from the coil 220 are amplified and waveform-shaped by using the buffer circuits 24S and 24R and the Schmitt circuits 25S and 25R to increase the "H" (active level) pulse widths of the signals VS2 and VR2, which are input signals to the set input portion S and the reset input portion R of the latch circuit 27, as compared with the "H" (active level) pulse widths of the induced voltage signals RX1 and RX2, thereby transmitting signals with high reliability.

That is, the first signal shaping circuit constituted by the buffer circuit 24S and the Schmitt circuit 25S and the second signal shaping circuit constituted by the buffer circuit 24R and the Schmitt circuit 25R generate the signals VS2 and VR2 (first and second logic setting signals) indicating "H" (active level) in first and second logic setting periods exceeding periods for which the induced voltage signals RX1 and RX2 (first and second transformer output signals) indicate "H" (active level). This allows the latch circuit 27 serving as an output signal generation circuit to generate the output signal XOUT reliably reflecting the instruction contents of the signal VS2 (=VS3) and the signal VR2 (=VR3).

In addition, preventing the set input portion S and the reset input portion R of the latch circuit 27 from being simultaneously set in the ON state ("H" level) by using the control circuit 26 can prevent malfunction and signal delays caused by the simultaneous ON state.

That is, the control circuit 26, which is a logic setting signal control circuit, invalidates the signals VS2 and VR2 when both the signals VS2 and VR2 indicate "H" (active level), thereby reliably avoiding a situation in which both the signals VS2 and VR2 are set at "H" when the latch circuit 27 generates the output signal XOUT. This makes it possible to improve the reliability of the output signal XOUT.

In addition, the control protection elements 23S and 23R (first and second control protectors) invalidate the induced voltage signals RX1 and RX2 (first and second transformer output signals) in first and second mask periods. This makes it possible to improve the reliability of the output signal XOUT generated by the latch circuit 27 by setting, in the first mask period, a period in which there is no need to detect that the input signal XIN has changed to "H" (first logic level) and also setting, in the second mask period, a period in which there is no need to detect that the input signal XIN has changed to "L" (second logic level) in the control protection elements 23S and 23R.

More specifically, in the control protection element 23S, a period in which the output signal XOUT has already indicated "H" (first logic level) is set as the first mask period, thereby improving the reliability of "H" of the output signal XOUT generated by the latch circuit 27.

Likewise, in the control protection element 23R, a period in which the output signal XOUT has already indicated "L" (second logic level) is set as the second mask period, thereby improving the reliability of "L" of the output signal XOUT generated by the latch circuit 27.

Accordingly, the signal transmission circuit 6 according to the first embodiment outputs the output signal XOUT accurately reflecting the input signal XIN, and hence can transmit signals with high reliability.

In addition, as shown in FIG. 2, the power conversion device 60 includes the signal transmission circuit 6 according to the first embodiment to improve resistance to noise in signal transmission when the controller 4 transmits the control signal S4 to the driver unit 3, thereby improving reliability and preventing malfunction and signal delays. This enables the long-term use of the power conversion device 60.

Second Embodiment

Figure 14:
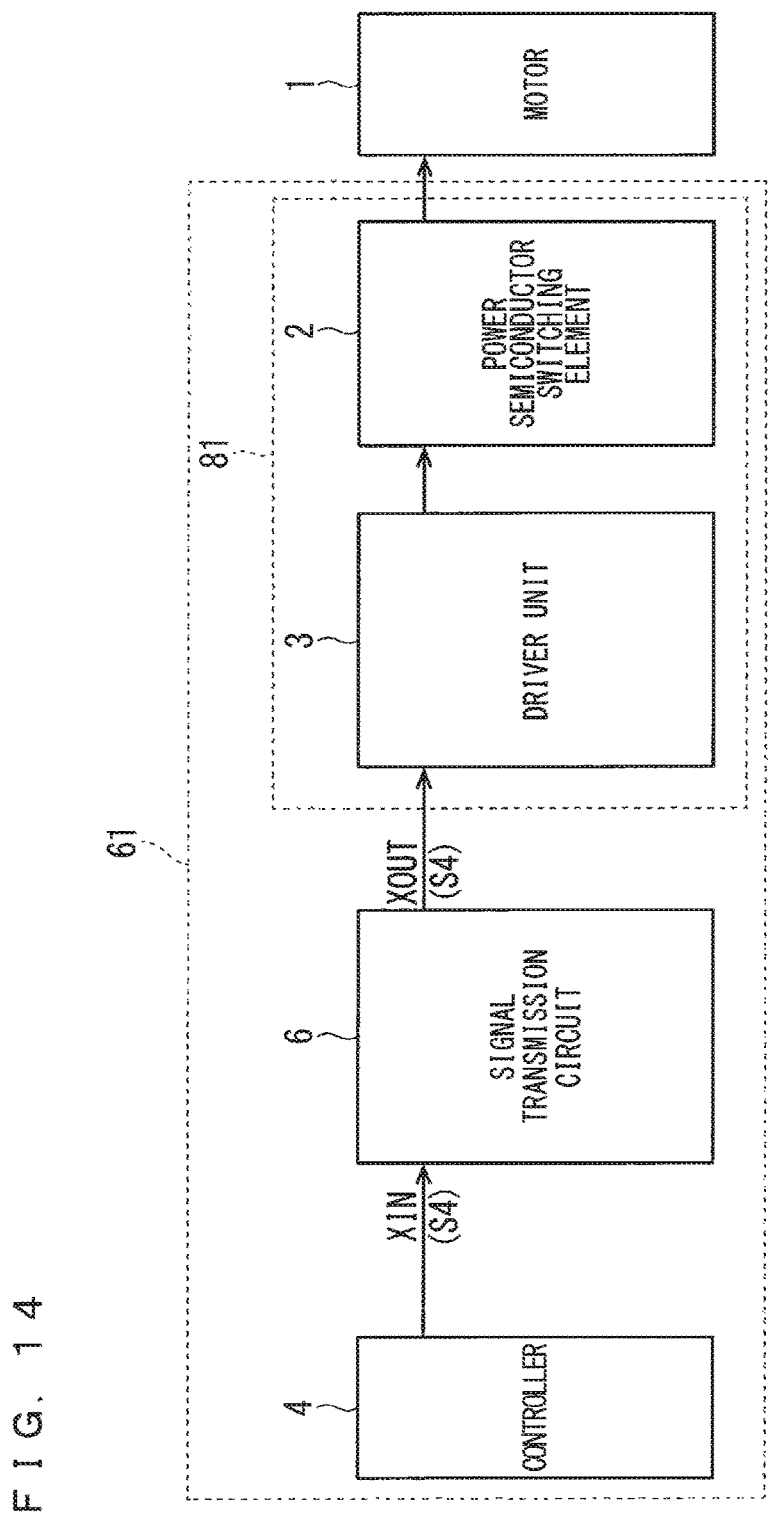
FIG. 14 is a block diagram showing an arrangement according to a first aspect in a power conversion device according to a second embodiment of the present invention.

FIG. 14 is a block diagram showing an arrangement in which a first aspect of a power conversion device according to a second embodiment of the present invention is applied to motor control. FIG. 14 shows the arrangement of a power conversion device 61 including the signal transmission circuit 6 according to the first embodiment described above.

As shown in FIG. 14, the power conversion device 61 provided to control a motor 1 used in a hybrid vehicle, electric vehicle, or the like includes a single-unit power module 81 obtained by integrating one or a plurality of power semiconductor switching elements 2 (FIG. 14 shows one power semiconductor switching element 2) and a driver unit 3 by resin sealing, a controller 4 that generates a control signal S4 for the driver unit 3 to cause the driver unit 3 to drive the power semiconductor switching element 2, and a signal transmission circuit 6 that transmits the control signal S4 from the controller 4 to the driver unit 3.

The signal transmission circuit 6 is provided between the controller 4 and the driver unit 3. The signal transmission circuit 6 insulates the controller 4 from devices to be controlled by high voltages, such as the driver unit 3, the power semiconductor switching element 2, and the motor 1, receives the control signal S4 from the controller 4 as an input signal XIN, and outputs the signal as an output signal XOUT.

The power conversion device 61 according to the second embodiment includes the signal transmission circuit 6 that improves the accuracy of signal transmission and promotes the prevention of malfunction and signal delays and the single-unit power module 81 constituted by the power semiconductor switching element 2 and the driver unit 3. This can improve the accuracy of signal transmission by the power conversion device 61 and promote the prevention of malfunction and signal delays. This in turn enables the long-term use of the power conversion device 61.

Figure 15:
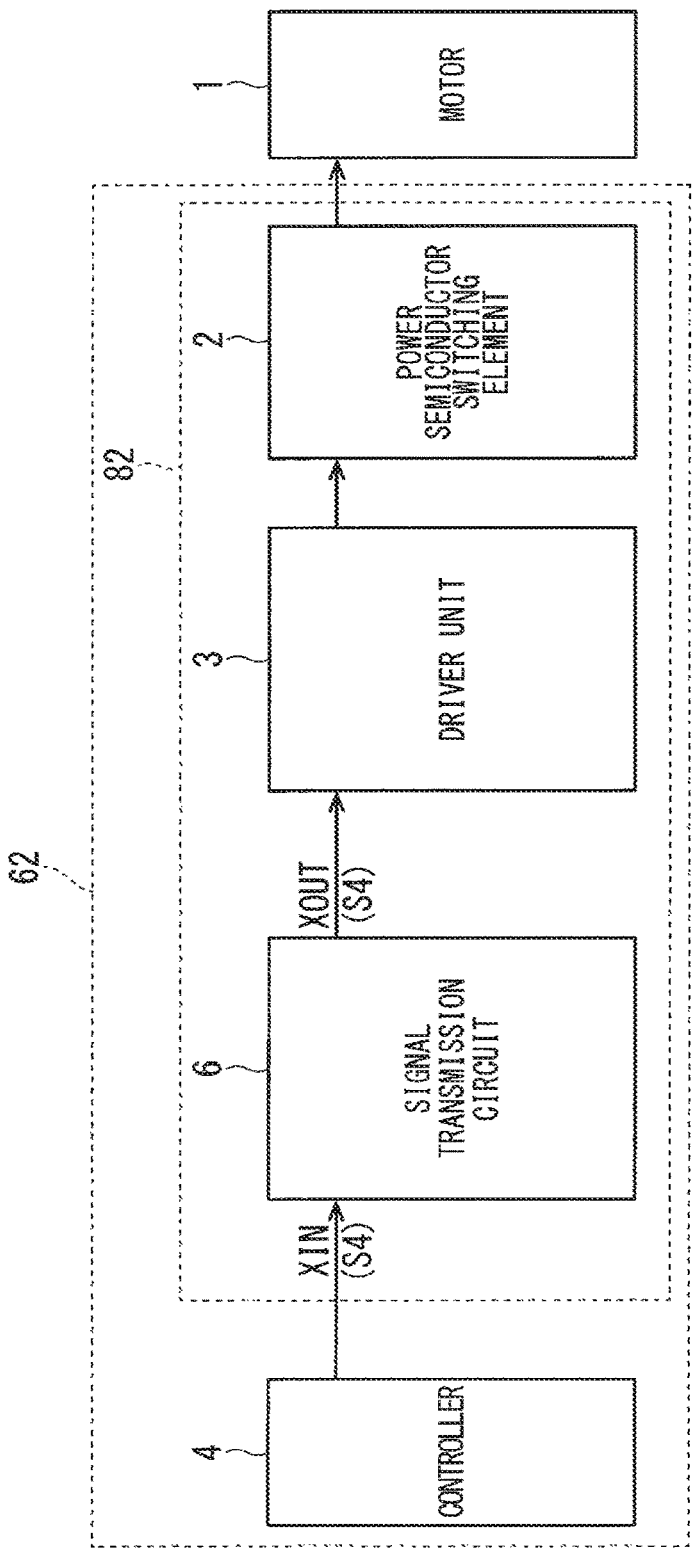
FIG. 15 is a block diagram showing an arrangement according to a second aspect in the power conversion device according to the second embodiment of the present invention.

FIG. 15 is a block diagram showing an arrangement in which a second aspect of the power conversion device according to the second embodiment of the present invention is applied to motor control. As shown in FIG. 15, it is also possible to use a power conversion device 62 including a single-unit power module 82 obtained by integrating the signal transmission circuit 6 together with the power semiconductor switching element 2 and the driver unit 3 by resin sealing. This makes it possible to obtain the same effects as those of the first aspect.

Figure 16:
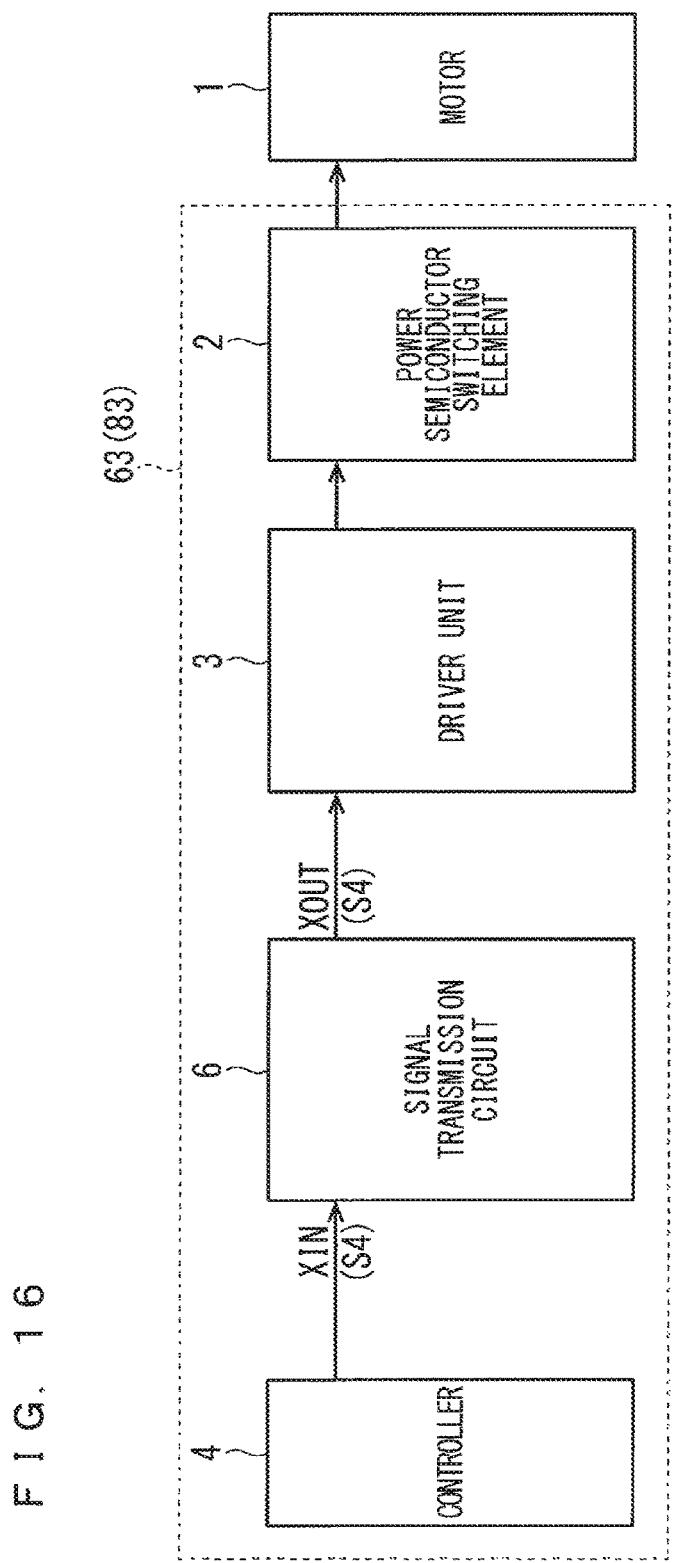
FIG. 16 is a block diagram showing an arrangement according to a third aspect in the power conversion device according to the second embodiment of the present invention.

FIG. 16 is a block diagram showing an arrangement in which a third aspect of the power conversion device according to the second embodiment of the present invention is applied to motor control. As shown in FIG. 16, a single-unit power module 83 obtained by integrating the controller 4 together with the power semiconductor switching element 2, the driver unit 3, and the signal transmission circuit 6 by resin sealing may itself be a power conversion device 63, which can obtain the same effects as those of the first aspect.

Third Embodiment

FIG. 17 is a block diagram showing an arrangement according to a first aspect in which a power conversion device according to a third embodiment of the present invention is applied to motor control. The following will exemplify a power conversion device 71 including the signal transmission circuit 6 according to the first embodiment described above.

As shown in FIG. 17, the power conversion device 71 provided to control a motor 1 used in hybrid vehicle, electric vehicle, or the like includes a single-unit power module 84 obtained by integrating one or a plurality of power semiconductor switching elements 2, a driver unit 3, and an abnormality detector 5 by resin sealing, a controller 4 that generates a control signal S4 for the driver unit 3 to cause the driver unit 3 to drive the power semiconductor switching element 2, a signal transmission circuit 6A (first signal transmission circuit) that transmits the control signal S4 from the controller 4 to the driver unit 3, and a signal transmission circuit 6B (second signal transmission circuit) that transmits an abnormality detection signal S5 detected by the abnormality detector 5 to the controller 4.

The abnormality detector 5 is an existing component part that detects a short-circuited state or heated state of the power semiconductor switching element 2 or a drop in the control power supply voltage of the driver unit 3 and then outputs the abnormality detection signal S5 indicating a corresponding abnormality state to provide protection against the short-circuited state or heated state of the power semiconductor switching element 2 or a drop in the control power supply voltage of the driver unit 3.

The signal transmission circuit 6A and the signal transmission circuit 6B each have an arrangement having a function substantially equivalent to that of the signal transmission circuit 6 according to the first embodiment.

The signal transmission circuit 6A is provided between the controller 4 and the driver unit 3. The signal transmission circuit 6A insulates the controller 4 from devices to be controlled by high voltages, such as the driver unit 3, the power semiconductor switching element 2, the motor 1, and the abnormality detector 5, receives the control signal S4 from the controller 4 as an input signal XIN1, and outputs the signal as an output signal XOUT1.

The signal transmission circuit 6B is provided between the controller 4 and the abnormality detector 5. The signal transmission circuit 6B insulates the controller 4 from devices to be controlled by high voltages, such as the driver unit 3, the power semiconductor switching element 2, the motor 1, and the abnormality detector 5. The signal transmission circuit 6B receives, as an input signal XIN2, the abnormality detection signal S5 output from the abnormality detector 5 that detects an abnormal operation such as a power supply voltage drop, overcurrent, or excessive temperature that has occurred in the single-unit power module 84 constituted by the driver unit 3, the power semiconductor switching element 2, and the like, and outputs the detection signal as an output signal XOUT2.

The power conversion device 71 according to the third embodiment includes the signal transmission circuits 6A and 6B (first and second signal transmission circuits) that improve the accuracy of signal transmission and promote the prevention of malfunction and signal delays and the single-unit power module 84 obtained by integrating the power semiconductor switching element 2, the driver unit 3, and the abnormality detector 5. This can improve the accuracy of signal transmission by the power conversion device 71 and promote the prevention of malfunction and signal delays. This in turn enables the long-term use of the power conversion device 71 having an abnormality detection function using the abnormality detector 5.

Figure 18:
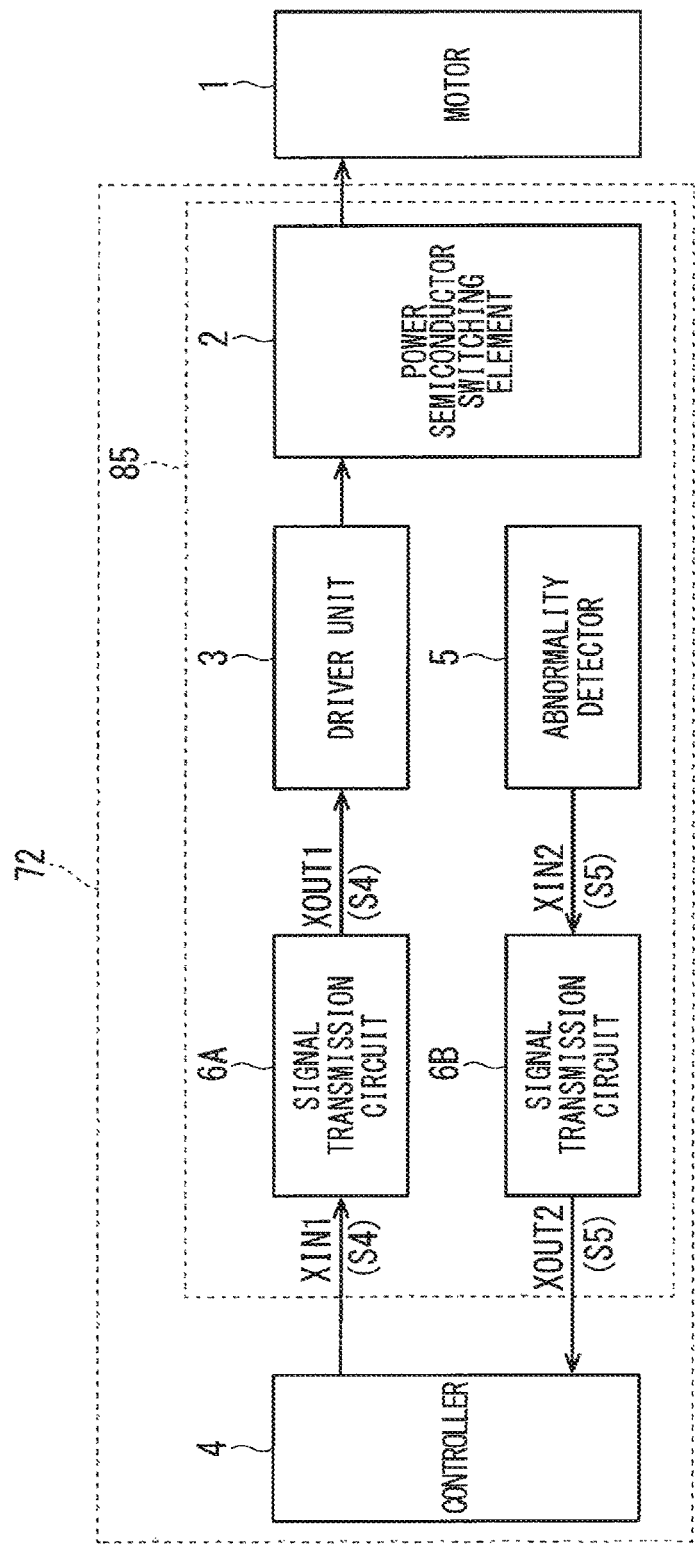
FIG. 18 is a block diagram showing an arrangement according to a second aspect in the power conversion device according to the third embodiment of the present invention.

FIG. 18 is a block diagram showing an arrangement in which a second aspect of the power conversion device according to the third embodiment of the present invention is applied to motor control. As shown in FIG. 18, it is also possible to use a power conversion device 72 including a single-unit power module 85 obtained by integrating the signal transmission circuit 6A and the signal transmission circuit 6B together with the power semiconductor switching element 2, the driver unit 3, and the abnormality detector 5 by resin sealing. This makes it possible to obtain the same effects as those of the first aspect.

Figure 19:
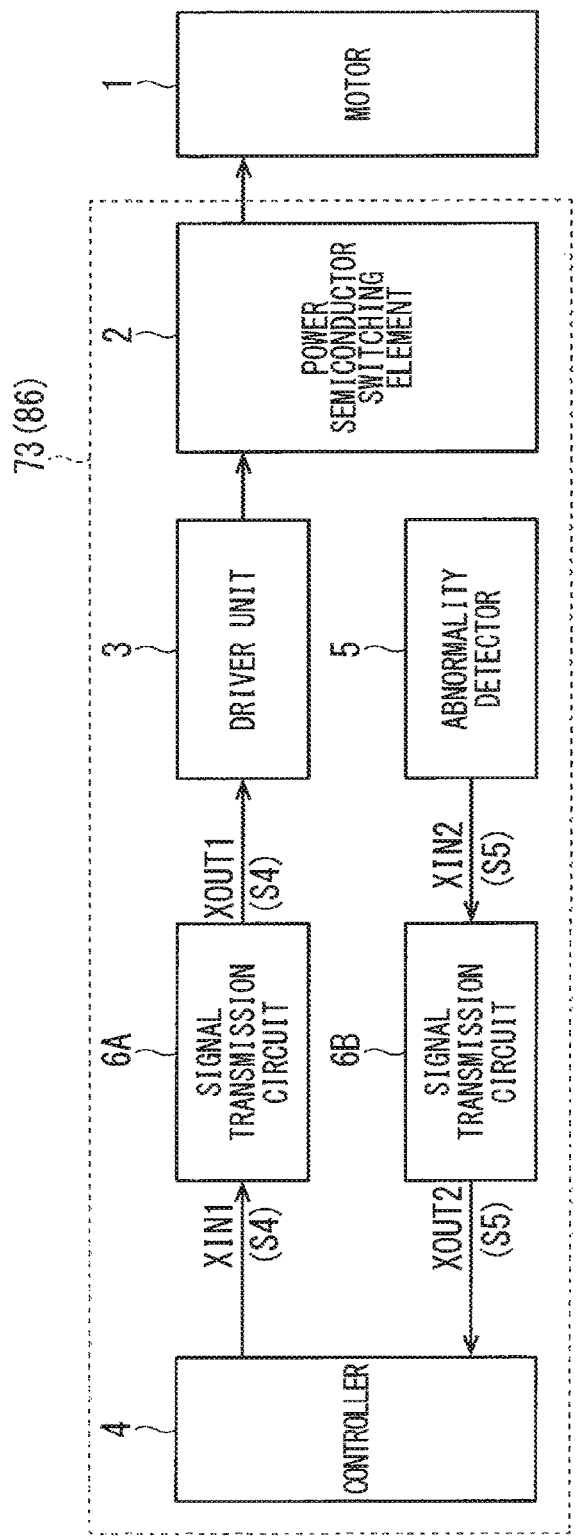
FIG. 19 is a block diagram showing an arrangement according to a third aspect in the power conversion device according to the third embodiment of the present invention.

FIG. 19 is a block diagram showing an arrangement in which a third aspect of the power conversion device according to the third embodiment of the present invention is applied to motor control. As shown in FIG. 19, a single-unit power module 86 obtained by integrating the controller 4 together with the power semiconductor switching element 2, the driver unit 3, the abnormality detector 5, the signal transmission circuit 6A, and the signal transmission circuit 6B by resin sealing may itself be a power conversion device 73, which can obtain the same effects as those of the first aspect.

Note that the respective embodiments of the present invention can be freely combined within the scope of the invention, and each embodiment can be modified or omitted as needed.

Although the present invention has been described in detail above, the above description is exemplary in all aspects, and the invention is not limited to this. It should be understood that countless modifications not illustrated are conceivable without departing from the scope of the present invention.

The invention claimed is:

1. A signal transmission circuit comprising:
    a first circuit to output first and second transmission signals on the basis of an external input signal;
    first and second transformers to receive said first and second transmission signals on a primary side and obtain first and second transformer output signals on a secondary side; and
    a second circuit to generate an external output signal on the basis of said first and second transformer output signals,
    wherein said external input signal has first and second logic levels, changes from the second logic level to the first logic level at a first transition time, and changes from the first logic level to the second logic level at a second transition time,
    said first circuit outputs said first and second transmission signals such that said first transmission signal changes between the first and second logic levels in a first period when said external input signal is at the first logic level, is fixed to the second logic level when said external input signal is at the second logic level, and is set at the first logic level for a predetermined period at said first transition time of said external input signal, and
    such that said second transmission signal changes between the first and second logic levels in a second period when said external input signal is at the second logic level, is fixed to the second logic level when said external input signal is at the first logic level, and is set at the first logic level for a predetermined period at said second transition time of said external input signal, and
    said second circuit includes
    first and second control protectors to invalidate said first and second transformer output signals for first and second mask periods on the basis of the first or second logic level of said external output signal,
    a first signal shaping circuit to receive said first transformer output signal via said first control protector and generate a first logic setting signal indicating an active level for a first logic setting period exceeding a period for which said first transformer output signal indicates an active level,
    a second signal shaping circuit to receive said second transformer output signal via said second control protector and generate a second logic setting signal indicating an active level for a second logic setting period exceeding a period for which said second transformer output signal indicates an active level,
    a logic setting signal control circuit to receive said first and second logic setting signals and invalidate indication of an active level by said first and second logic setting signals when both said first and second logic setting signals indicate an active level, and
    an output signal generation circuit to receive said first and second logic setting signals via said logic setting signal control circuit and generate said external output signal that is set at one logic level of first and second logic levels when said first logic setting signal indicates an active level, and set at the other logic level when said second logic setting signal indicates an active level.

2. The signal transmission circuit according to claim 1, wherein
    said first control protector sets, as said first mask period, a period for which said external output signal indicates the first logic level, and
    said second control protector sets, as said second mask period, a period for which said external output signal indicates the second logic level.

3. A power conversion device comprising:
    a power semiconductor switching element;
    a driving circuit to drive said power semiconductor switching element;
    a controller to generate a control signal for causing said driving circuit to drive said power semiconductor switching element; and
    the signal transmission circuit according to claim 1,
    wherein said signal transmission circuit is provided between said controller and said driving circuit, insulates said controller from said driving circuit, receives said control signal from said controller as said external input signal, and outputs said external output signal to said driving circuit.

4. The power conversion device according to claim 3, wherein said driving circuit and said power semiconductor switching element are integrally formed into a single-unit power module.

5. The power conversion device according to claim 4, wherein said signal transmission circuit is further integrally formed into said power module.

6. The power conversion device according to claim 5, wherein said controller is further integrally formed into said power module.

7. A power conversion device comprising:
a power semiconductor switching element;
a driving circuit to drive said power semiconductor switching element;
a controller to generate a control signal for causing said driving circuit to drive said power semiconductor switching element; and
an abnormality detector to detect an abnormal state caused in said power semiconductor switching element or said driving circuit and output an abnormality detection signal; and
first and second signal transmission circuits, said first and second signal transmission circuits each including the signal transmission circuit according to claim 1,
wherein said first signal transmission circuit is provided between said controller and said driving circuit, insulates said controller from said driving circuit, receives said control signal from said controller as said external input signal, and outputs said external output signal to said driving circuit, and
said second signal transmission circuit is provided between said controller and said abnormality detector, insulates said controller from said abnormality detector, receives said abnormality detection signal from said abnormality detector as said external input signal, and outputs said external output signal to said controller.

8. The power conversion device according to claim 7, wherein said driving circuit, said power semiconductor switching element, and said abnormality detector are integrally formed into a single-unit power module.

9. The power conversion device according to claim 8, wherein said first and second signal transmission circuits are further integrally formed into said power module.

10. The power conversion device according to claim 9, wherein said controller is further integrally formed into said power module.

* * * * *